(12) United States Patent
Plankell (10) Patent No.: US 7,709,733 B1
(45) Date of Patent: May 4, 2010

(54) RECESSED SIGNAL-RECEIVER MOUNTING SYSTEM FOR A BUILDING STRUCTURE AND ASSOCIATED METHODS

(76) Inventor: Gary Dean Plankell, 9346 Lake Hickory Nut Dr., Winter Garden, FL (US) 34787

( * ) Notice: Subject to any disclaimer, the term of this patent is extended or adjusted under 35 U.S.C. 154(b) by 183 days.

(21) Appl. No.: 11/563,862

(22) Filed: Nov. 28, 2006

Related U.S. Application Data (63) Continuation-in-part of application No. 10/734,569, filed on Dec. 12, 2003, now Pat. No. 7,141,736.

(51) Int. Cl.
*H02G 3/08* (2006.01)
(52) U.S. Cl. .............................. 174/50; 174/53; 174/58; 174/57; 220/3.2; 220/3.3; 248/906
(58) Field of Classification Search ................ 174/50, 174/480, 481, 53, 57, 58, 17 R, 59, 61, 62, 174/63, 503; 220/3.2–3.9, 4.02; 248/906; 439/535, 536; 379/428.01, 428.02, 428.03, 379/428.04
See application file for complete search history.

(56) References Cited

U.S. PATENT DOCUMENTS

| | | | |
|---|---|---|---|
| 3,622,029 A | 11/1971 | Ware | |
| 3,690,501 A | 9/1972 | Ware | |
| 3,749,815 A | 7/1973 | Boatwright et al. | |
| 3,859,454 A * | 1/1975 | Mann ........................ | 174/66 |
| 3,927,785 A | 12/1975 | Kinney et al. | |
| 3,980,197 A | 9/1976 | Ware | |
| 4,062,470 A | 12/1977 | Boteler | |
| 4,151,926 A | 5/1979 | Kinney et al. | |
| 4,613,728 A | 9/1986 | Lathrop | |
| 4,758,687 A | 7/1988 | Lathrop | |
| 4,988,832 A | 1/1991 | Shotey | |
| 5,189,259 A | 2/1993 | Carson et al. | |
| 5,243,134 A | 9/1993 | Nattel | |
| 5,257,946 A | 11/1993 | MacMillan et al. | |
| 5,289,934 A | 3/1994 | Smith et al. | |
| 5,378,854 A * | 1/1995 | Hoover ........................ | 174/53 |
| 5,419,716 A | 5/1995 | Sciammarella et al. | |
| 5,574,256 A | 11/1996 | Cottone | |
| 5,596,174 A | 1/1997 | Sapienza | |
| 5,621,788 A | 4/1997 | Eiken | |

(Continued)

OTHER PUBLICATIONS

NFPA®, Communications Circuits, National Electric Code®, Article 800, 2008, pp. 70-645, 646.

*Primary Examiner*—Angel R Estrada
(74) *Attorney, Agent, or Firm*—Terry M. Sanks; Beusse Wolter Sanks Mora & Maire, P.A.

(57) ABSTRACT

A system for mounting a pair of signal-receiving devices recessed within a building surface includes a base housing having an inner chamber and positionable behind a building surface. A front has a first opening, and a wall has a second and third opening. A secondary housing is positionable adjacent the base housing and has an interior space. A first aperture is positionable in communication with the second opening. A second aperture is positioned in spaced relation from the base housing's wall. A first signal receiver is positionable within the interior space and is connectable to a first signal carrier. A second signal receiver is positionable within the inner chamber and has a second connector positionable adjacent the third opening and connectable to a second signal carrier.

21 Claims, 10 Drawing Sheets

U.S. PATENT DOCUMENTS

| | | |
|---|---|---|
| 6,207,895 B1 | 3/2001 | Engel |
| 6,229,087 B1 | 5/2001 | Archer |
| 6,552,269 B1 * | 4/2003 | Conner .......................... 174/67 |
| 7,141,736 B2 * | 11/2006 | Plankell ....................... 174/50 |

* cited by examiner

RECESSED SIGNAL-RECEIVER MOUNTING SYSTEM FOR A BUILDING STRUCTURE AND ASSOCIATED METHODS

CROSS-REFERENCE TO RELATED APPLICATION

This application is a continuation-in-part of and claims priority to application Ser. No. 10/734,569, filed Dec. 12, 2003, now U.S. Pat. No. 7,141,736, issued Nov. 28, 2006, the contents of which are incorporated herein by reference.

BACKGROUND OF THE INVENTION

1. Field of the Invention

The present invention relates generally to recessed outlets, particularly wall-mounted recessed hardware power, telephone, and cable outlets. In other embodiments, the recessed housing can be in other parts of a building.

2. Description of the Related Art

As a result of the rapid evolution of hardware such as telephones, computers, and audio-visual equipment, the need for sources of a signal has increased. Cordless devices such as cordless telephones typically include a "base station" which includes a receptacle for low voltage alternating current or direct current electrical power and a telephone connection jack. The base station also often includes a pair of slots and wall mounting screws to mount the base station vertically on a wall for easy access. The second part of the cordless phone includes a "handset" that is battery-operated and charged from the base station. Typically, separate electrical outlets and telephone connection outlets are generally spaced apart to receive respective separate electric power cords and telephone cords running from the base station of the cordless phone. Each of the separate electrical outlets and telephone connection jacks is generally mounted flush with an adjacent wall surface. Such mounting necessitates that electrical plugs and telephone jack connectors extend outwardly from the surrounding wall surface, and the respective electric power cord and the telephone cord be strung to the base station. The wiring is especially visually obtrusive where the base station is mounted to the building wall. Also, owing to the nature of the power requirements of cordless telephone base stations, the "plug" for the base station is normally a rather large alternating current adapter (transformer), some much larger than the others. The conventional electric power plugs and alternating current adapters may be partially dislodged as a result of inadvertent contact by persons or objects. A partial dislodgement generally exposes the prongs of the electrical plug, which exposure creates an electrical hazard. Additionally, both the electrical power cord and telephone cord are not only unsightly, but excess lengths of the cords can get tangled and can potentially cause a tripping hazard.

Other types of hardware devices can also require a multiplicity of connectors and signal-requiring means, such as computers and televisions with and without cable service, corded telephones, and other audio-visual equipment.

Thus there is a need for a system for mounting a hardware device that can accommodate, for example, alternating current power adapters and associated excess electrical power cord, surge protection devices, and external signal-receiving means.

SUMMARY OF THE INVENTION

The present invention is directed to a distribution system for mounting a pair of signal-receiving devices in a recessed position within a building surface. It is to be understood herein that "signal-receiving devices" is intended to be broadly construed, and can include wiring, fiber-optic lines, power strips, low-voltage devices, processors of virtually any type, surveillance equipment, and routers. The distribution system can comprise a base housing having a wall defining an inner chamber. The base housing has a first opening in a front thereof and a second and a third opening in the wall. Each of the first, the second, and the third opening lead into the inner chamber. The base housing is positionable behind a building surface, such as a wall, ceiling, or floor of an interior of the building.

A secondary housing is positionable behind the building surface and adjacent the base housing. The secondary housing has a wall defining an interior space. The wall has a first aperture therethrough into the interior space that is positionable in communication with the base housing's second opening. The wall further has a second aperture therethrough into the interior space. The second aperture is positioned in spaced relation from the base housing's wall.

A first signal receiver is positionable within the secondary housing's interior space and has a first connector that is positionable adjacent the first aperture. The first connector is connectable to a first signal carrier.

A second signal receiver is positionable within the base housing's inner chamber and has a second connector that is positionable adjacent the third opening. The second connector is connectable to a second signal carrier.

DETAILED DESCRIPTION

The present invention now will be described more fully hereinafter with reference to FIGS. 1-21. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout, and prime or double prime, if used indicates similar elements on alternative embodiments.

As illustrated in FIGS. 1-14, embodiments of the present invention advantageously provide an apparatus and methods for mounting a cordless device such as a telephone 20, cellular telephone or similar telecommunications device, cordless toothbrush (not shown) or other cordless device having either a charging base station, or device requiring connection to an alternating current (AC) power plug, in a building or furniture structure to provide reduced wiring visualization and exposure. The following exemplary embodiments describe the apparatus with respect to telephone 20 for illustrative purposes only. The cordless telephone provides the best illustrative example because the cordless telephone is currently one of the most common forms of cordless device which requires both a connection to an AC power plug via an AC power cord and a connection to a telephone jack via a telephone cord. Thus, an apparatus for mounting a cordless telephone must provide not only the ability to reduce wiring visualization and exposure of an AC power cord but also the ability to reduce wiring visualization and exposure for a telephone cord. Additionally, the cordless telephone is currently one of the most commonly wall or furniture mounted cordless devices and thus commands a higher commercial recognition of the need for an apparatus to mount such cordless device.

Figures 1, 2:
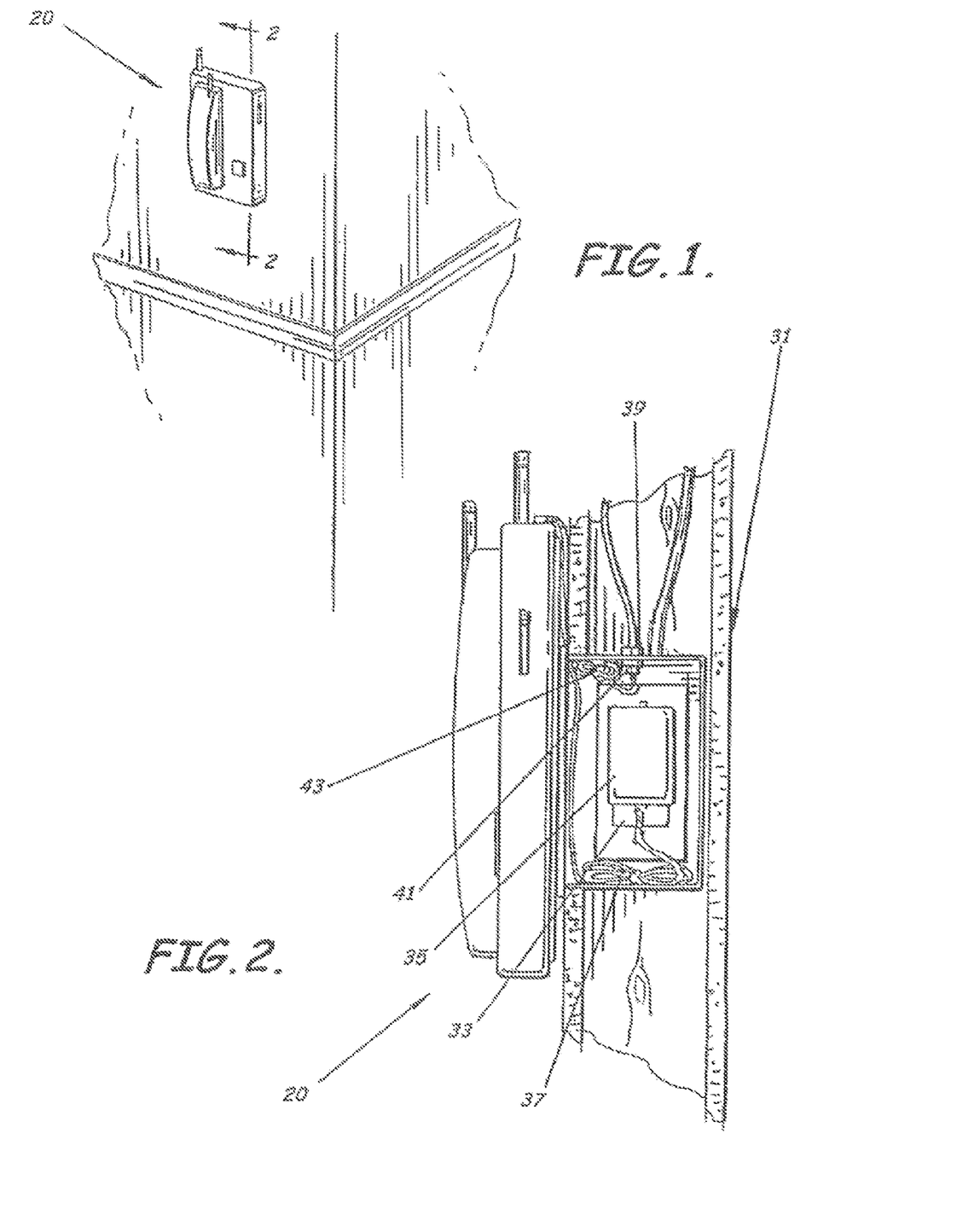
FIG. 1 is a environmental perspective view of a cordless telephone mounted with an apparatus for mounting a telephone in a building structure according to an embodiment of the present invention.
FIG. 2 is a side elevation sectional view of an apparatus for mounting a telephone in a building structure taken along line 2-2 of FIG. 1 according to an embodiment of the present invention.

As perhaps best shown in FIGS. 1 and 2, the apparatus 31 can simultaneously house an AC female electrical power outlet 33, an AC power plug 35 for a cordless telephone 20, an AC power cord 37 connected to the AC power plug 35, a female telephone jack 39, a male telephone jack connector 41, and a telephone phone cord 43 connected to the male telephone jack connector 41. The ability to simultaneously house both the telephone cord 43 and AC power cord 37 and related components is especially important because it provides a significant reduction in wiring visualization and protects the cords 37, 43, and related components from being damaged by environmental hazards. Note, the AC power cord may in fact be conducting direct-current (DC) power to the cordless device depending upon the power requirements of the selected cordless device and configuration of the AC power plug or adapter.

Figures 3, 4, 5:
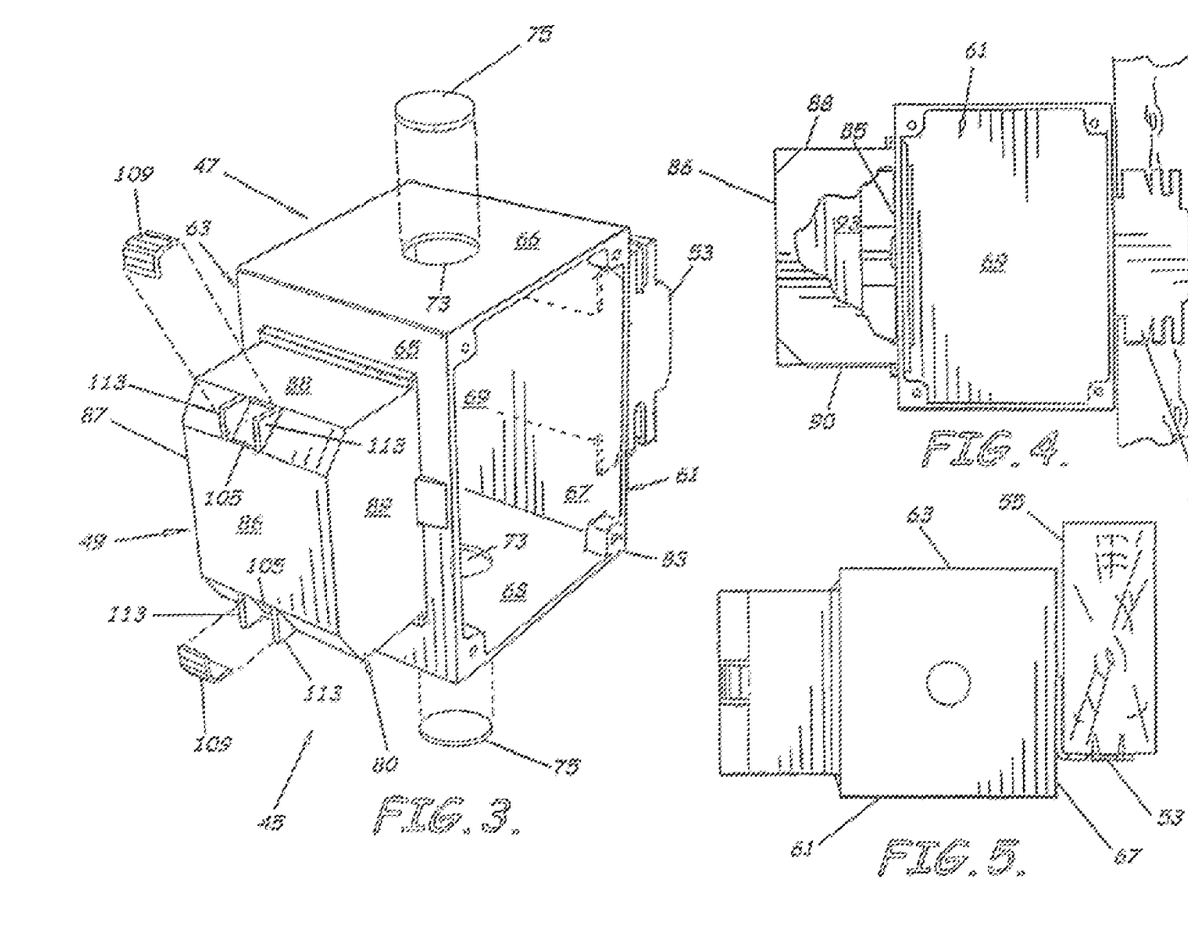
FIG. 3 is a partially exploded perspective view of an apparatus for mounting a telephone in a building structure according to an embodiment of the present invention.
FIG. 4 is a front elevation view of the apparatus of FIG. 3 attached to a building stud of a building structure according to an embodiment of the present invention.
FIG. 5 is a top plan view of the apparatus of FIG. 3 attached to a building stud according to an embodiment of the present invention.

As perhaps best shown in FIG. 3, the apparatus 31 generally includes an electrical power and telephone outlet housing 45 formed by combining a base housing 47 and a power outlet housing 49. As shown in FIG. 2, the combination base housing and power outlet housing 45 is adapted to be recessed within an interior wall of a building structure to house the telephone and AC electric cords 43, 37, and related components of the cordless telephone 20. The apparatus 31 can also include a base housing cover plate 51 (FIG. 9) to enclose a significant portion of the telephone and AC electric cords 43, 37, and related components within the base housing 47, and to provide for mounting and connection of the cordless telephone 20. The apparatus 31 can also include a wall or furniture mounting flange 53 connected to the base housing 47 that is adapted to be connected to a building or furniture structural member such as a wall stud 55.

More specifically, the electrical power and telephone outlet housing 45 includes a base housing 47 having a base open front 61, a base backwall 63, and four base sidewalls 65, 66, 67, 68, (two lateral, a top, and a bottom), which extend between the base open front 61 and the base backwall 63. The walls of the base housing 47 form a base inner chamber 69 positioned between the base backwall 63 and base sidewalls 65, 66, 67, 68, so that the base open front 61 provides access to the base inner chamber 69. The base open front 61 is sized to allow the passage into the base inner chamber 69 of the AC power plug 35 to engage the AC female electrical power outlet 33, the AC power cord 37, the male telephone jack connector 41 to engage the female telephone jack 39, and the telephone cord 20. This allows the outlet housing 45 to be positioned behind a desk, furniture, or other such obstruction where there is limited space, whether or not base housing cover plate 51 is utilized.

Figures 6, 7:
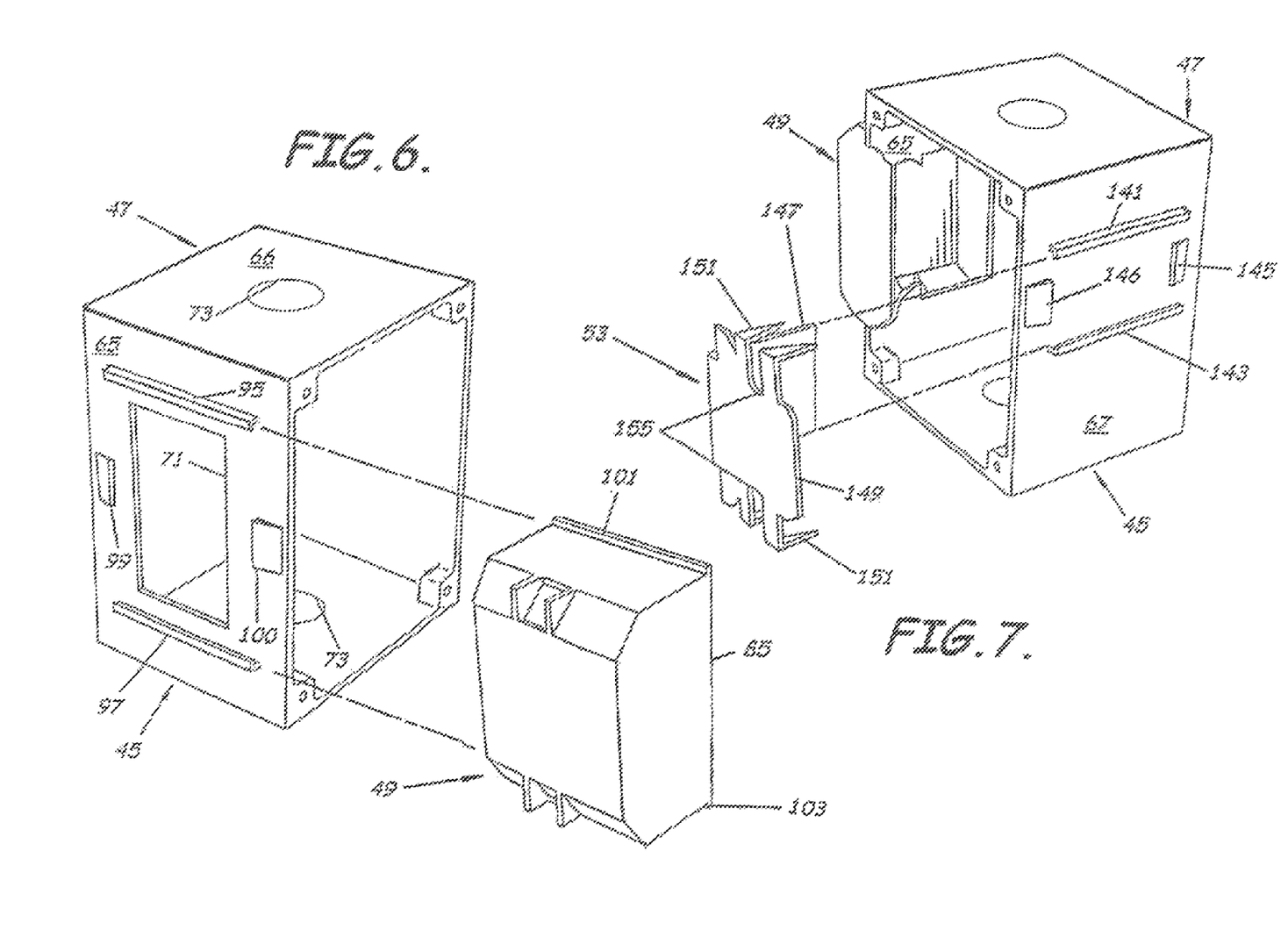
FIG. 6 is an exploded perspective view of an apparatus for mounting a telephone in a building structure according to an embodiment of the present invention.
FIG. 7 is an exploded perspective view of an apparatus for mounting a telephone in a building structure according to an embodiment of the present invention.

As shown in FIG. 6, a first base sidewall 65, positioned transverse to and extending between the base open front 61 and the base backwall 63 of the base housing 47, has a power outlet aperture 71 sized and positioned to receive the AC female electrical power outlet 33. Preferably, the first base sidewall 65 is one of the lateral sidewalls in order to accommodate the standard size and design of typical AC female electrical power outlets 33 which tend to be much longer than they are wide. Note, though the figures only show a single AC female electrical power outlet 33, installation of a second is contemplated within the scope of the present invention.

Figure 8:
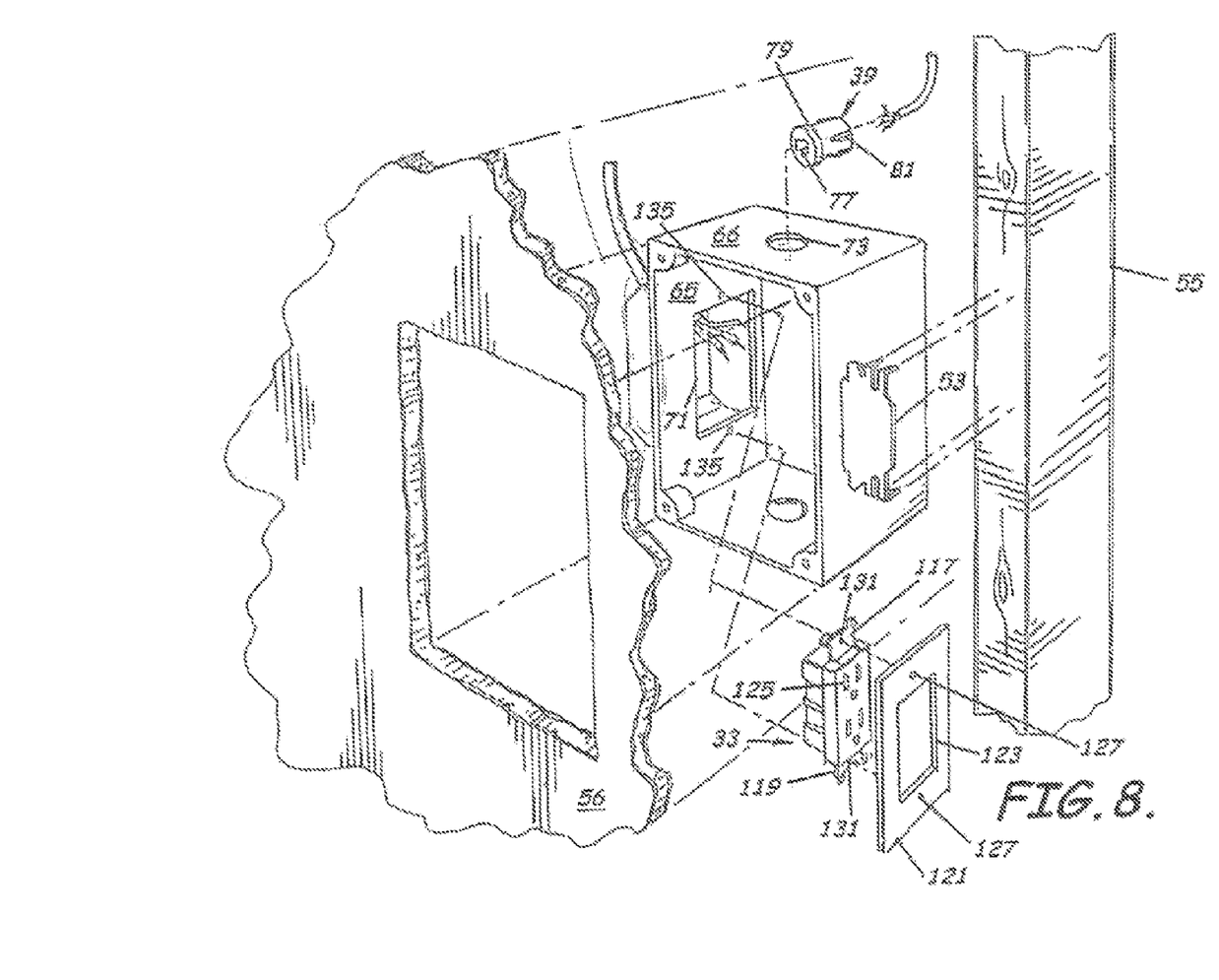
FIG. 8 is an exploded environmental view of an apparatus for mounting a telephone in a building structure according to an embodiment of the present invention.

As perhaps best shown in FIG. 3, a second base sidewall, also positioned transverse to and extending between the base open front 61 and the base backwall 63 of the base housing 47, has a female telephone jack aperture 73 to receive the female telephone jack 39 (FIG. 8). Preferably, the second base sidewall is either the top or bottom base sidewalls 66, 68, in order to provide minimal interference with the AC female power outlet/power plug 33, 35, and a wall mounting flange 53. A third base sidewall, opposite the second base sidewall is correspondingly the other of the top or bottom base sidewalls 66, 68, and can also be configured with a female telephone jack aperture 73 to receive a female telephone jack 39. At least one but preferably both of the top base sidewall and bottom base sidewalls 66, 68, include a pre-scored surface 75 adapted to be detached by a user to form the female telephone jack aperture 73 defining a removable telephone jack knockout. The knockout can provide a user a selectable aperture for connecting the female telephone jack 39 to the base housing 47 to accommodate either top side or bottom side building structure telephone wiring. Though not typical, the knockout can also provide an aperture for connecting lateral or backside building structure telephone wiring. In an alternative embodiment of the present invention, aperture 73 positioned preferably in top sidewall 66 can instead be used to provide heat ventilation for base housing 47 to vent residual heat generated especially when the AC power plug 35 is in the form of a high-power/high-drain transformer-adapter positioned within the base inner chamber 69. The associated knockout 75 can, however, remain connected to top sidewall 66 when the female telephone jack 39 is not used and the AC power plug 35 is not in the form of a high-power/high-drain transformer adapter.

As shown in FIG. 8, the female telephone jack 39 includes the proximal end, a distal end, and a body extending therebetween sized to fit in the female telephone jack aperture 73. The female telephone jack has a cavity 77 for receiving a male telephone jack connector 41. In the configuration shown in FIG. 8, the proximal end of the female telephone jack 39 has a proximal surface extension 79 to provide an inner stop, and the body has a plurality of side connectors 81 to form an outer stop. The combination of the proximal surface extension 79 and plurality of side connectors 81 provide a positive lock of the female telephone jack 39 within the telephone jack aperture 73, when so positioned. Note, other geometric configurations allowing a female telephone jack 39 to be secured within a female telephone jack aperture 73 are within the scope of the present invention.

A fourth base sidewall 67, also positioned transverse to and extending between the base open front 61 and the base backwall 63 of the base housing 47, is used for the attachment of the apparatus 31 to a wall stud 55. The third base sidewall 67 is preferably opposite the first base sidewall 66 to minimize conflict between the building structure telephone and electrical wiring and the wall mounting flange 53, described later. Note, although the figures depict the power outlet housing 49 (described later) attached to base sidewall 65, and depict wall mounting flange 53 (described later) attached to base sidewall 67, the position of the power outlet housing 49 and wall mounting flange 53 can be reversed and still be within the scope of the present invention.

Figure 9:
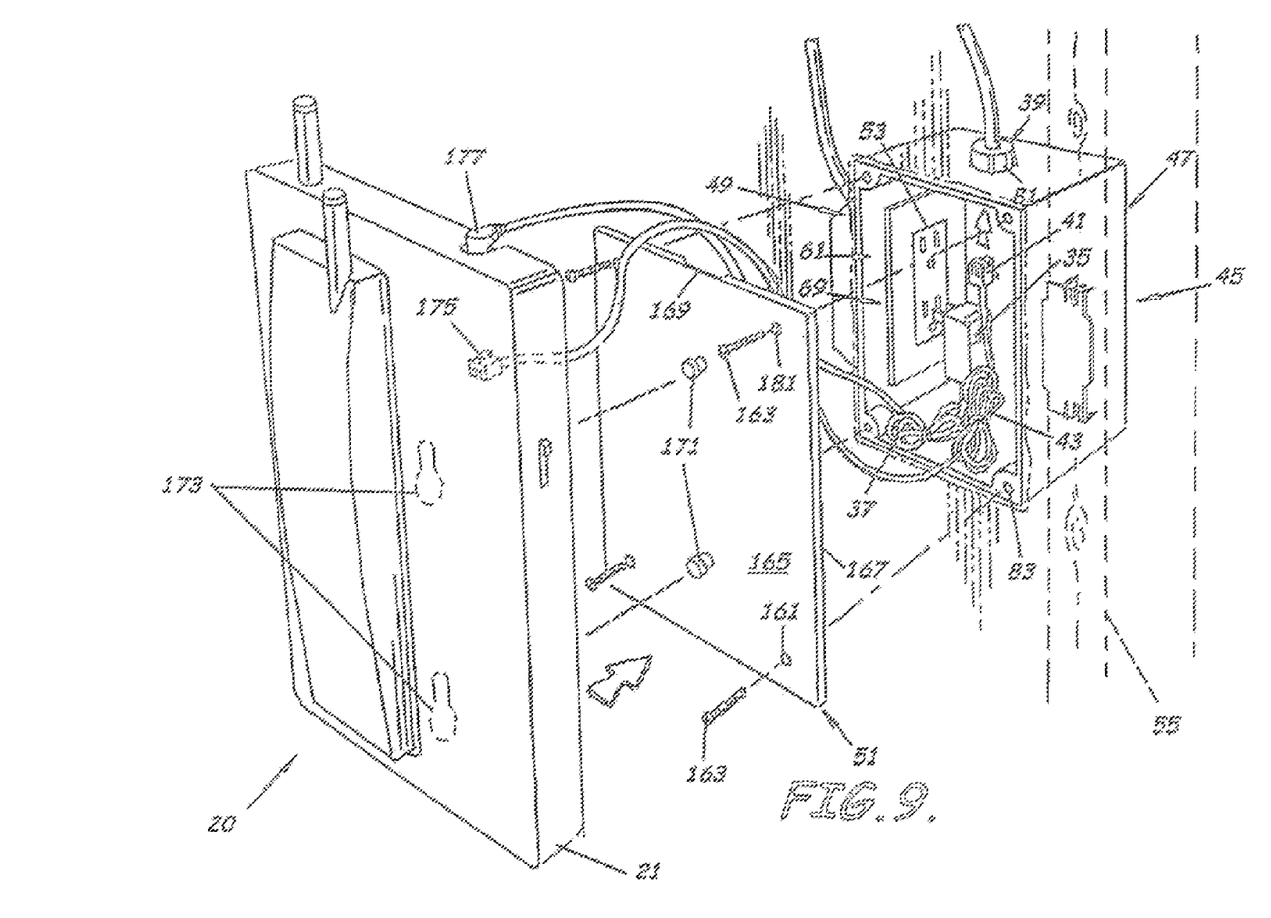
FIG. 9 is a partially exploded perspective view of a cordless telephone mounted with an apparatus for mounting a telephone in a building structure according to an embodiment of the present invention.

As shown in FIGS. 3 and 9, the base housing 47 also includes means for connecting the base housing cover plate 51 to the base housing 47. For example, a portion of the means can include base housing cover plate supports 83 which can be positioned at least partially within the base inner chamber 69 adjacent the inner perimeter of the base open front 67. The base housing cover plate supports 83 provide a mounting connection for a base housing cover plate 51 (FIG. 9) to connect the base housing cover plate 51 to the base housing 47 adjacent the base open front 61 of the base housing 47. Other supports, fasteners, or connectors as known by those skilled in the art are, however, within the scope of the present invention.

As shown in FIGS. 3 and 4, the electrical power and telephone outlet housing 45 also includes a power outlet housing 49 connected to the first base sidewall 65 of the base housing 47 for receiving and housing at least a portion of the AC female electric outlet 33. The power outlet housing 49 has a power outlet open front 85, a power outlet backwall 86, and four base sidewalls 87, 88, 89, 90, (two lateral, a top, and a bottom) which extend between the power outlet open front 85 and the power outlet backwall 86. The walls of the power outlet housing 49 form an auxiliary inner chamber 93 positioned between the power outlet backwall 86 and the power outlet sidewalls 87, 88, 89, 90. The power outlet open front 85 provides access to the auxiliary inner chamber 93 and is positioned to interface with the power outlet aperture 71 (FIG. 6) of the first base sidewall 65 of the base housing 47. Connecting the power outlet housing 49 to, for example, lateral side 65 or 67, of the base housing 47, rather than the base backwall 63, serves to reduce overall depth of the combination base housing and power outlet housing 45 within the building or furniture structure. This feature allows the base housing 47 base inner chamber 69 to be much larger than would otherwise be possible if the power outlet housing 49 were instead connected to the base backwall 63, and thus allows for enclosing larger AC power plugs 35 and longer AC power cords and telephone cords 37, 43.

There are several methodologies of connecting the power outlet housing 49 to the base housing 47. As perhaps best shown in FIG. 6, in an embodiment of the present invention, the outer surface of the first base sidewall 65 of the base housing 47 is configured with a transversely extending upper rail 95, a lower rail 97 substantially parallel to and spaced apart from the upper rail 95, and a lateral stop 99 preferably positioned adjacent the back ends of the upper and lower rails 95, 97, and adjacent the base backwall 63. Correspondingly, the power outlet housing 49 includes an upper flange 101 and a lower flange 103 substantially parallel to and spaced apart from the upper flange 101 and positioned adjacent the power outlet open front 85 of the power outlet housing 49. In this configuration, the power outlet housing 49 is slidably connected to the outer surface of the first base sidewall 65 along the upper and lower flanges 101, 103, between the upper rail 95, lower rail 97, and lateral stop 99 of the base housing 47 to provide for quick mounting and removal of the power outlet housing 49 from the base housing 47. When the base housing 47 is properly positioned within the interior wall, the drywall 56 (FIG. 9) acts as a forward stop to hold the power outlet housing 49 in a proper position on the rails 95, 97. Forward stop 100 can also serve such purpose if so configured. Alternative configurations are, however, within the scope of the present invention. For example, instead of using rails 95, 97, fasteners or other connection means as shown by those skilled in the art can instead be used to connect the power outlet housing 49 to the base first sidewall 65 of the base housing 47.

As perhaps best shown in FIG. 3, at least one, but preferably two, power outlet sidewalls such as top and bottom power outlet sidewalls 88, 90, and/or the power outlet backwall 86 includes a pre-scored surface adapted to be detached by a user to form the building structure AC electrical wiring apertures 105 defining a removable electrical wiring knockout 109. The knockout 109 provides the user a selectable passageway to more easily accommodate top side and bottom side building AC electrical wiring (FIG. 8) to connect to and supply electrical power to the AC female electrical power outlet 33. The power outlet housing 49 further includes a pair of external spaced apart protuberances 113 positioned adjacent the building structure AC electrical wiring aperture 105 to provide guidance for passage of the building structure AC electrical wiring through the AC electrical wiring aperture 105 and into the auxiliary inner chamber 93 of the power outlet housing 49 to connect to and supply electrical power to the AC female electrical power outlet 33.

As shown in FIGS. 8 and 9, the AC female electric outlet 33 is positioned at the power outlet open front 89 so that its front side faces the base inner chamber 69 of the base housing 47 and its backside faces the auxiliary inner chamber 93 of the power outlet housing 47. The AC female electric outlet 33 has an upper and a lower flange 117, 119, used to secure the AC female electric outlet 33 to the inner surface of the first base sidewall 65 above and below the power outlet aperture 71, respectively. As noted above, at least one of the power outlet sidewalls 87, 88, 89, 90, and/or the power outlet backwall 86 includes the building structure AC electrical wiring aperture 105 which is adapted to allow passage of building structure AC electrical wiring into the auxiliary inner chamber 93 of the power outlet housing 49 to connect to and supply electrical power to the AC female electrical power outlet 33 when so positioned inside the power outlet housing 49. The AC electrical wiring and building structure telephone wiring enter separate chambers of the combination power and telephone outlet housing 45 due to electrical wiring code requirements.

A power outlet cover plate 121 can be positioned in the base inner chamber 69 of the base housing 47 to overlie portions of the power outlet open front 85 of the power outlet housing 49 and inner surface portions of the first base sidewall 65 and the power outlet aperture 71 to cover the outer periphery of the AC female electrical power outlet 33 and further enclose the auxiliary inner chamber 93 of the power outlet housing 49 between the base housing 47 and the power outlet housing 49. The power outlet cover plate 121 has at least one power outlet cover aperture 123 extending therethrough and sized to surround the at least one AC electrical socket 125 of the AC female electrical power outlet 33 to provide access to the AC female electrical power outlet 33 when positioned in the auxiliary inner chamber 93 of the power outlet housing 49. The power outlet cover plate 121 also includes a plurality of power outlet connection apertures 127 positioned to align with at least two flange apertures 131 extending from the AC female electrical power outlet 33 and at least two apertures or bores 135 in the first base sidewall 65 of the base housing 47 to connect the power outlet cover plate 121 and AC female electrical power outlet 33 to the first base sidewall 65 of the base housing 47. Although other configurations are within the scope of the present invention, the above described configuration is preferred as it allows for use of commercially available female electrical power outlets 33 and power outlet cover plates 121.

As shown in FIGS. 5 and 7, a wall mounting flange 53 can be connected to the outer surface of the fourth base sidewall, such as base sidewall 67, to provide connection of the combination base housing and power outlet housing 45 to a wall stud 55 of the building structure. In an embodiment of the present invention, the fourth base sidewall of the base housing 47 (base sidewall 67) is positioned opposite the first base sidewall 65 and has an exterior surface which includes a transversely extending upper rail 141 and a lower rail 143 substantially parallel to and spaced apart from the upper rail 141. The upper and lower rails 141, 143, provide a slidable mounting structure. The fourth base sidewall 67 also has a lateral or aft stop 145 adjacent the back ends of the upper and lower rails 141, 143. In this embodiment, the wall mounting flange 53 has first and second mounting plates 147, 149, which substantially form an L-shape. The first mounting plate 147 of the wall mounting flange 53 is slidably connected to and substantially parallel with the exterior surface of the fourth base sidewall 67 along the upper rail 141 and the lower rail 143 to provide for quick mounting of the wall mounting flange 53 to and removal from the base housing 47. The lateral stop 145 provides an aft stop to the first mounting plate 147 for proper positioning of the wall mounting flange 53. In this embodiment, when the base housing cover plate 51 is installed, the base housing 47 is slid forward on the upper and lower rails 141, 143, until the lateral stop 145 contacts the back end of the first mounting plate 147. Thus, the base housing cover plate 51 in conjunction with the drywall 56 can provide a forward stop to "lock" the base housing 47 in the proper position on the rails 141, 143, within the building structure. Lateral stop 146 can also serve such purpose, if the fourth base sidewall is so configured. Note, other alternative configurations are within the scope of the present invention. For example, instead of using rails 141, 143, fasteners can instead be used to connect the wall mounting flange 53 to the fourth base sidewall 67 of the base housing 47. Also, the wall mounting flange 53 and base housing 47 can be more permanently connected through means such as welding, or other methods also known by those skilled in the art.

The second mounting plate 149 of the wall mounting flange 53 can include mounting spikes 151 which can be adapted to pierce the wall stud 55 and can be positioned substantially parallel to the fourth sidewall 67 to connect the combination base housing and power outlet housing 45 to the wall stud 55 of the building structure. Additionally, the second mounting plate 149 can have either apertures or slots 155 for allowing attachment of the plate 149 to the wall stud 55 using additional fasteners or stud connectors (not shown), such as nails, screws, or an adhesive. In either case, this configuration is primarily implemented in new construction where the drywall 56 has not yet been installed or in existing construction where the drywall 56 has been removed from the wall stud 55 adjacent to the position the apparatus is to be mounted.

Figure 10:
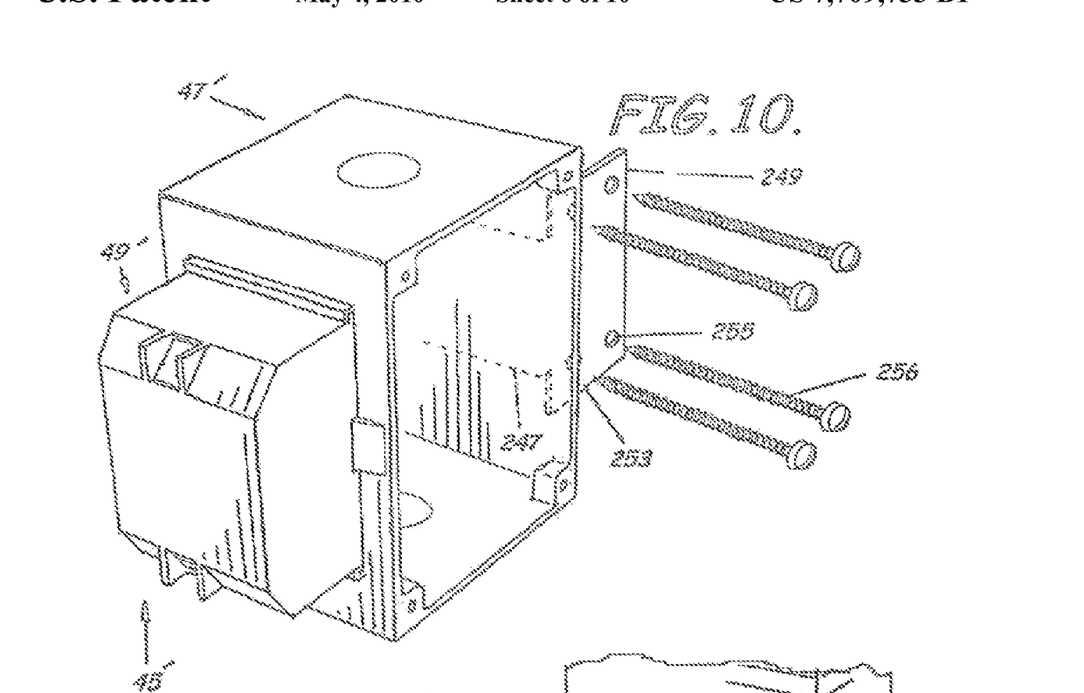
FIG. 10 is a partially exploded perspective view of an apparatus for mounting a telephone in a building structure according to another embodiment of the present invention.

As shown in FIG. 10, in another embodiment of the present invention, a mounting flange 253 is connected to an electrical power and telephone outlet housing 45' formed by connecting base housing 47' with power outlet housing 49'. The mounting flange 253 includes a first and second mounting plates 247, 249. The second mounting plate 249 is substantially flat and contains a plurality of slots or apertures 255 which are adapted to receive fasteners or stud connectors such as, for example, nails or screws 256 to affix the second mounting plate 249, and thus the combination base housing and power outlet housing 45', to a wall stud. This configuration can be used in both new construction and existing construction.

Figure 11:
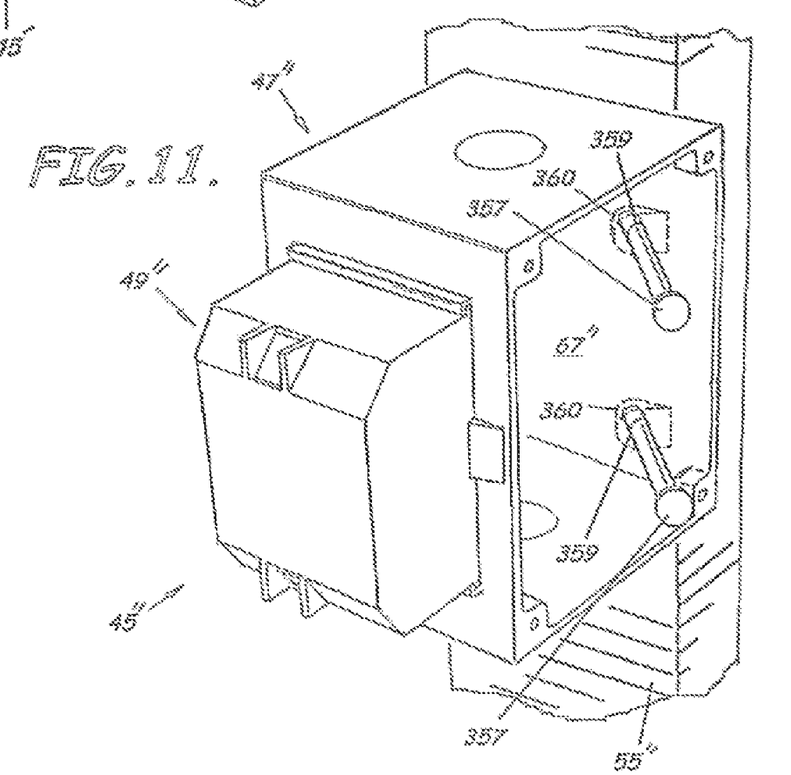
FIG. 11 is a perspective view of an apparatus for mounting a telephone in a building structure according to yet another embodiment of the present invention.
Figure 12:
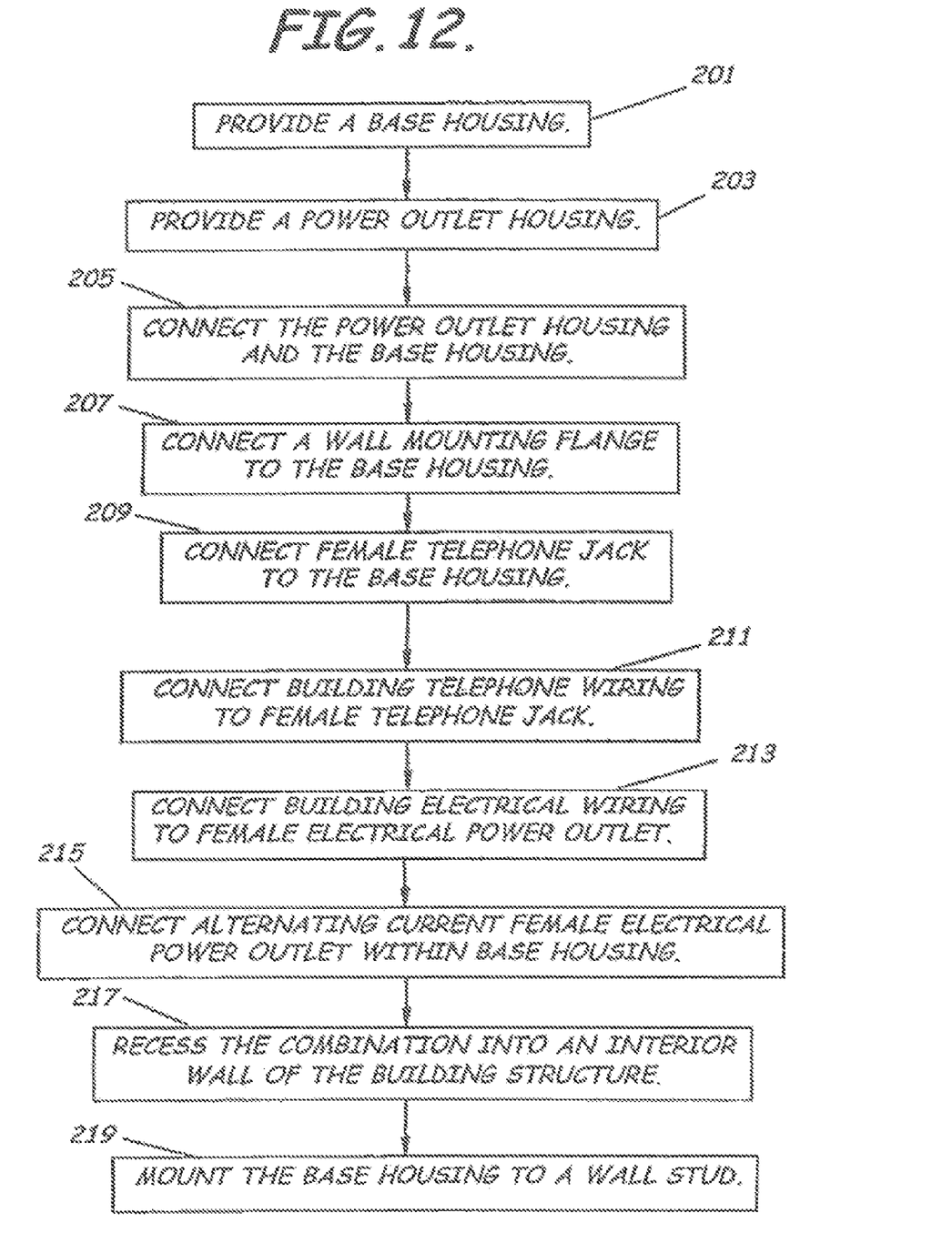
FIG. 12 is a flowchart of a method to mount an outlet housing for a telephone in a building structure according to an embodiment of the present invention.

As perhaps best shown in FIG. 11, in another embodiment of the present invention, instead of using a separate wall mounting flange, the fourth base sidewall 67" of the base housing 47" of the combination electrical power and telephone outlet housing 45" can be attached directly to a wall stud 55" through use of fasteners or stud connectors such as, for example, nails or screws 357, adhesive, or other similar means as known by those skilled in the art. The fourth base sidewall 67" can have a plurality of wall stud connection apertures 359 to allow such connection of the fourth base sidewall 67" directly to the wall stud 55". Additionally, the fasteners can be of a type known by those skilled in the art which can be hammered, screwed, or otherwise caused to penetrate through the fourth base sidewall 67" to form the apertures 359. If nail or screw-type fasteners are used and are to be angled into the wall stud 55" rather than be introduced perpendicular to the base sidewall 67", angled spacers 360 can be used to provide added stability and to provide a structurally sound connection to stud 55".

As illustratively shown in FIG. 9, in either of the configurations described above, the apparatus 31 can also include a base housing cover plate 51 positioned to cover the base open front 61 of the base housing 47 and to enclose, within the base inner chamber 69, major lengthwise extent of the telephone cord 43 connected to the male telephone jack connector 41 and AC power cord 37 connected to the AC power plug 35 within the base inner chamber 69 of the base housing 47. With the base housing cover plate 51 installed, the major lengthwise extent of the telephone cord 43 and the AC power cord 37 are not readily visible outside of the base housing 47 (FIG. 2).

The base housing cover plate 51 can include means for connecting the base housing cover plate 51 to the base housing 47. For example, at least a portion of the means can include a plurality of base cover plate connection apertures 161 positioned to provide for the passage of a corresponding plurality of base housing cover plate connectors 163. The base housing cover plate connection apertures 161 align with the plurality of base housing cover plate supports 83 when the base housing cover plate 51 is positioned to cover the base open front 61 of the base housing 47 to thereby connect the base housing cover plate 51 to the base housing cover plate supports 83. Other connectors or fasteners, as known by those skilled in the art, are, however, within the scope of the present invention. Particularly, an alternative configuration includes connectors, fasteners, or the like, which can provide for a quick disconnect of the base housing cover plate 51 from the base housing 47 without tools but which are sufficiently strong enough to mount a cordless device.

The base housing cover plate 51 has a front cover plate surface 165 and an outer perimeter 167 surrounding the front cover plate surface 165. At least a portion of the outer perimeter 167 can be deflected away from the front cover plate surface 165 to further provide reduced wiring visualization and exposure when the base housing cover plate 51 is positioned to cover the base open front 61 of the base housing 47. The base housing cover plate 51 also has at least one cord channel 169 formed in a peripheral region of the base housing cover plate 51 which is adapted to allow passage of at least the AC power cord 37 and/or preferably the telephone cord 43 therethrough for connection of a telephone base such as the cordless phone base station 21 to the AC female electrical power outlet 33 and to the female telephone jack 39. The cord channel aperture 169 can alternatively be located at a central position on the base housing cover plate 51 or at an intermediate position therebetween. The base housing cover plate 51 can be larger than the base open front 61 of the base housing 47 in order to provide for a positive contact with the drywall 56 of the building structure or a furniture structure and thus, can form part of the wall or furniture mounting structure for the apparatus 31. The base housing cover plate 51 can also include means for connecting a cordless or telecommunication device such as telephone 20 to the base open front 61 of the base housing 47. For example, as shown in FIG. 9, telephone base mounts 171 can be adapted to connect to standard wall hanging slots 173 of a telephone base with respect to base station 21 of the cordless telephone 20. The mounts 171 in conjunction with slots 173 allow mounting of a cordless or telecommunication device such as the cordless telephone 20 to the interior wall of the building structure, as shown in FIG. 1. Mount or mounts 171 can be universal and repositionable upon the face of base housing cover plate 51 in order to accommodate a wide array of cordless device base station designs and can be of various configurations as known understood by those skilled in the art.

Advantageously, embodiments of the present invention include a method of mounting (FIG. 12), a method of installing (FIG. 13), and a method of using (FIG. 14) an outlet housing for a cordless or telecommunication device such as a telephone in a furniture or building structure to provide reduced wiring visualization exposure. As also shown in FIG. 6, the method of mounting the outlet housing includes a user (block 201) providing a base housing 47 having a base open front 61, a base backwall 63, and a plurality of base sidewalls 65, 66, 67, 68, extending between the base open front 61 and the base backwall 63 forming a base inner chamber 69 therein. The plurality of base sidewalls 65, 66, 67, 68, includes a first base sidewall 65 positioned transverse to and extending between the base open front 61 and the base backwall 63 and having at least one power outlet aperture 71 to receive an AC female electrical power outlet 33 therein. The user (block 203) provides a power outlet housing 49 having a power outlet open front 85, a power outlet backwall 86, and a plurality of power outlet sidewalls 87, 88, 89, 90, extending between the power outlet open front 89 and the power outlet backwall 86, forming an auxiliary inner chamber 93 therein. The user (block 205) connects the power outlet housing 49 to the first base sidewall 65 so that the power outlet open front 85 interfaces with the at least one power outlet aperture 71 of the first base sidewall 65 to thereby reduce overall depth of the combined base housing and power outlet housing 45 within the building structure.

As shown in FIG. 7, the user also (block 207) connects a wall mounting flange 53 preferably having at least one stud connection spike 151 to an exterior surface of a second sidewall 67 of the plurality of sidewalls 65, 66, 67, 68, of the base housing 47 which is preferably located opposite the first base sidewall 65 of the base housing 47. As shown in FIG. 8, the user (block 209) connects a female telephone jack 39 to preferably either a top or a bottom base sidewall 66, 68, of the base housing 47 having a female telephone jack aperture 73 sized to receive the telephone jack 39, and (block 211) connects the building telephone wiring to the female telephone jack 39 to provide telephone service capability to the female telephone jack 39. The user next (block 213) connects building electrical wiring to the AC female electrical power outlet 33 to provide AC electrical power service, and (block 215) connects an AC female electrical power outlet 33 at least partially within the base inner chamber 69 of the base housing 47.

As shown in FIG. 9, the user next (block 217) recesses the combined base housing and power outlet housing 45 within an interior wall surface of the building structure, and (block 219) mounts the base housing 47 to a wall stud 55 of the building structure by inserting the stud connection spikes 151, if so configured, into the wall stud 55 of the building structure, to thereby house a combination of the AC female electrical power outlet 33, the AC power plug 35 for the telephone 20, the AC power cord 37 connected to the AC power plug 35, the female telephone jack 39, at least one male telephone jack connector 41, and a telephone cord 43 connected to the male telephone jack connector 41 for connection to a cordless telephone 20.

Figure 13:
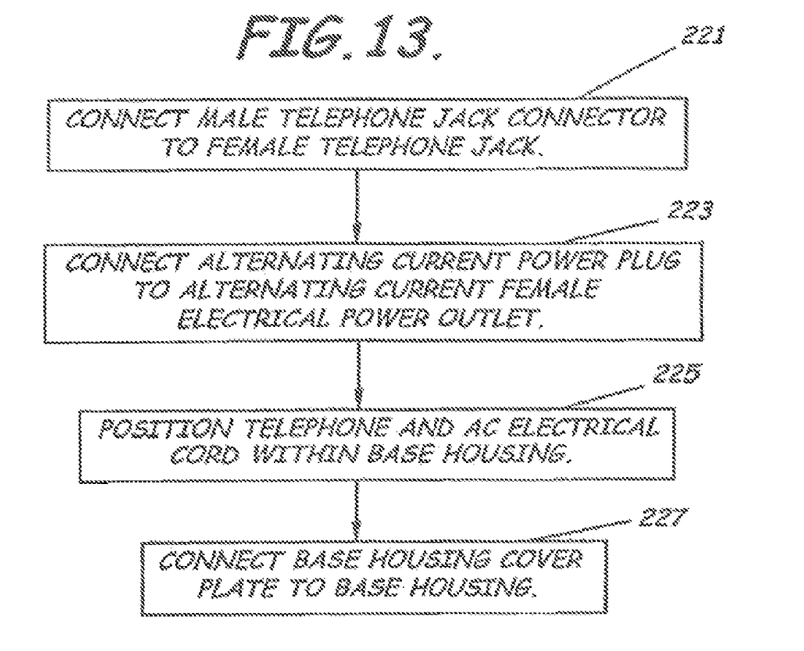
FIG. 13 is a flowchart of a method to install an outlet housing for a telephone in a building structure according to an embodiment of the present invention.

As shown in FIG. 13, an embodiment of the present invention includes a method for installing a telephone in a building structure to provide reduced wiring visualization exposure. As shown in FIG. 9, the method includes a user (block 221) connecting a male telephone jack connector 41 to a female telephone jack 39 positioned in a base inner chamber 69 of a base housing 47 and power outlet housing 49 combined and recessed within an interior wall of the building structure. The connection can be accomplished by passing the male telephone jack connector 41 through a base open front 61 of the base housing 47 to engage the female telephone jack 39. The method also includes (block 223) connecting the AC power plug 35 to an AC female electrical power outlet 33 positioned within the base housing and power outlet housing 45 by passing the AC power plug 35 through the base open front 61 of the base housing 47 to engage the AC female electrical power outlet 33. The user (block 225) then positions major lengthwise extent of a telephone cord 43 connected to the male telephone jack connector 41 and AC power cord 37 connected to the AC power plug 35 within the base inner chamber 69 of the base housing 47. The user then (block 227) connects a base housing cover plate 51 for the base housing 47 to a plurality of base housing cover plate connection supports 83 positioned within a base inner chamber 69 of the base housing 47 to cover a base open front 61 of the base housing 47, the base housing cover plate 51 having at least one cord channel 169 formed preferably in a peripheral region 167 of the base housing cover plate 51 adapted to allow passage of the AC power cord 37 and the telephone cord 43, therethrough.

Figure 14:
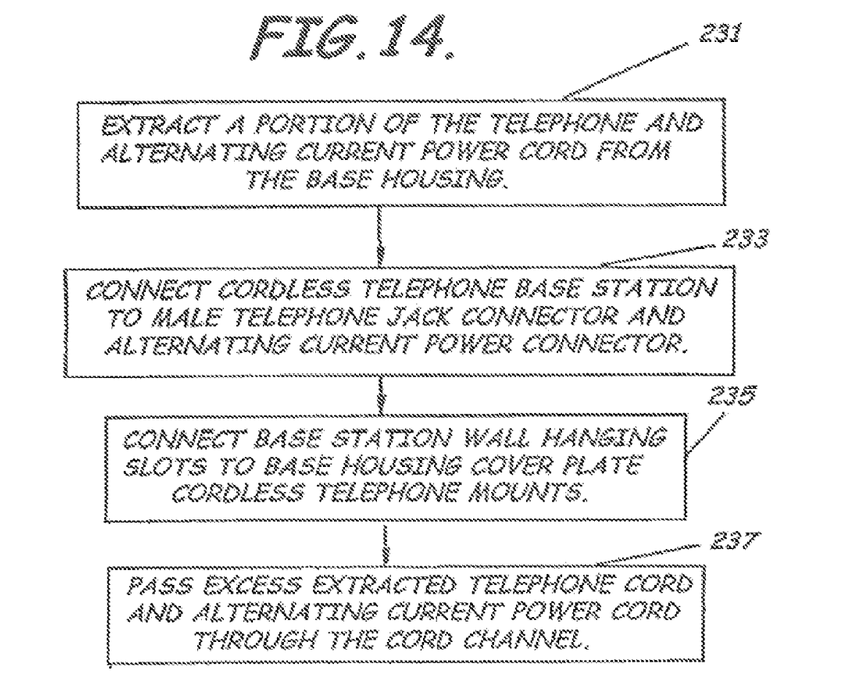
FIG. 14 is a flowchart of a method to use an outlet housing for a telephone in a building structure according to an embodiment of the present invention.

As shown in FIG. 14, an embodiment of the present invention includes a method for using a cordless telephone in a building structure to provide reduced wiring visualization exposure. As shown in FIGS. 2 and 9, the method includes a user (block 231) extracting from within a base inner chamber 69 of a base housing 47 recessed within a building interior wall a telephone cord 43 and an AC power cord 37 positioned therein, and passing the cords 37, 43, through a cord channel 169 in a base housing cover plate 51 as necessary to provide sufficient cord to connect a proximal male telephone jack connector 175 connected to the telephone cord 43 and a low voltage power connector 177 connected to the AC power cord 37 to a telephone base such as base station 21 of the cordless telephone 20. The distal male telephone jack connector 41 of the telephone cord 43 and AC power plug 35 of the AC power cord 43 should be previously connected within the base inner chamber 69 of the base housing 47. If not, the user can accomplish this task. The user then (block 233) connects the base station 21 of the cordless phone 20 to the proximal male telephone jack connector 175 of the telephone cord 43 and low voltage power connector 177 of the AC power cord 37, and (block 235) connects a plurality of wall hanging slots 173 of the base station 21 to a corresponding plurality of base housing cover plate telephone base mounts, such as cordless telephone base station mounts 171, to thereby mount the telephone to the interior wall of the building structure (FIG. 1). Finally, the user (block 237) passes excess extracted telephone cord 43 and AC power cord 37 back through the cord channel 169 in the base housing cover plate 51 and back into the base inner chamber 69 as necessary to further reduce wiring visualization exposure of excess extracted telephone cord 43 and AC power cord 37.

Another embodiment of a system 300 of the present invention will now be presented with reference to FIGS. 15-21. The system 300 is for mounting a pair of signal-receiving devices in a recessed position within a building surface, and comprises a base housing 301 (FIG. 15) that has top 302, bottom 303, back 304, and first 305 and second 306 side walls defining an inner chamber 307. As discussed above, the term "signal-receiving devices" is intended to be broadly construed as any device or carriage element that can transmit, receive, process, and carry a signal. Exemplary devices can include, but are intended to be limited to, Ethernet, intranet, and Internet connectors, processors in any form, power converters, routers, surge protection devices, wiring in any form, including fiber-optic cabling, surveillance equipment such as cameras and microphones.

Figure 15:
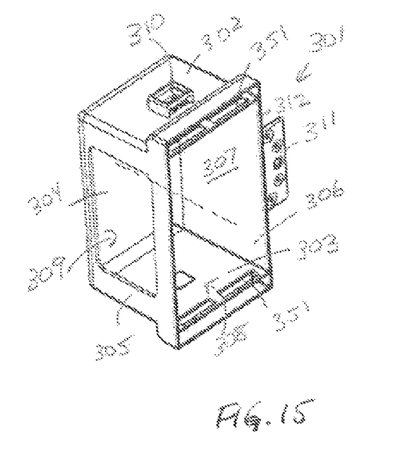
FIG. 15 is a front/side perspective view of a base housing for a further embodiment of the present invention.
Figure 16:
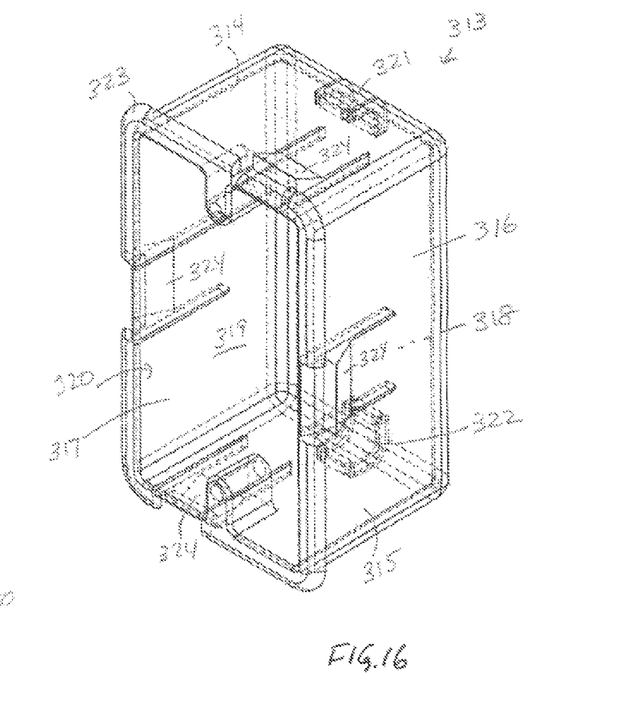
FIG. 16 is a front/side perspective view of a secondary housing for the embodiment of FIG. 15.
Figure 17:
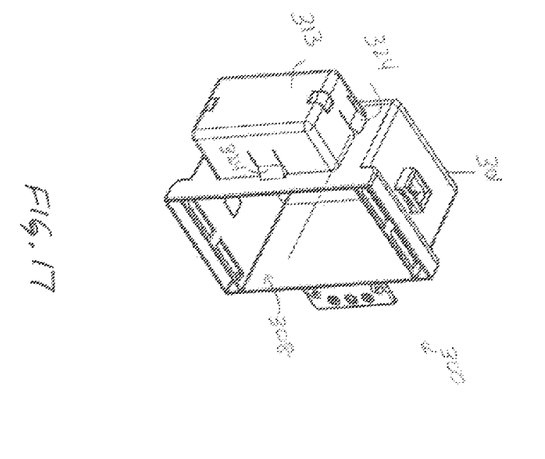
FIG. 17 is a front/side perspective view of the combined base housing and secondary housing for the embodiment of FIG. 15.

A first opening 308 is in a front of the base housing 301; a second opening 309 is in the first side wall 305; a third opening 310 is in the top wall 302. Each of the openings 308-310 leads into the inner chamber 307. The base housing 301 is dimensioned to be positionable behind a building surface, as outlined for previous embodiments discussed above. The building surface can comprise a wall, the ceiling, or the floor, and can be on an interior or exterior of the building.

The base housing 301 further comprises a wall mounting flange 311 that is connected to an outer surface 312 of the base housing's second side wall 306 for providing connection to a structural element behind the building surface.

A secondary housing 313 (FIG. 16) is also positionable behind the building surface and adjacent the base housing 301. The secondary housing 313 has top 314, bottom 315, back 316, front 317, and side 318 walls defining an interior space 319. A first aperture 320 into the interior space 319 opposite the side wall 318 is positionable in communication with the base housing's second opening 309. The top wall 314 and the bottom wall 315 further have a second 321 and a third 322 aperture therethrough into the interior space 319. The second 321 and the third 322 apertures are positioned in spaced relation from the base housing's first side wall 305.

The secondary housing 313 is dimensioned at the side wall 318 opposed to the first aperture 320 smaller than the base housing's second opening 309. The secondary housing 313 also has a protrusion, here, a lip 323 surrounding the first aperture 320 that is dimensioned larger than the base housing's second opening 309. Thus the secondary housing 313 is movable between a first position (FIG. 19A) within the base housing's inner chamber 307 and a second position (FIGS. 17 and 19B) wherein the secondary housing's side wall 318 is outside the base housing's inner chamber 307 and the secondary housing's lip 323 is retained within the inner chamber 307.

The secondary housing 313 further comprises four deformable tabs 324 that are positioned on the outer surfaces of the top 314, bottom 315, back 316, and front 317 walls. The tabs 324 are generally parallel to the lip 323 and are closer to the base housing's second opening 309 when the secondary housing 313 is in the first position. Here the tabs 324 are shown as being generally adjacent the lip 323, although this is not intended as a limitation. The deformable tabs 324 are depressable to a first orientation adjacent the secondary housing's respective walls 314-317 when the secondary housing 313 is being moved from the first position to the second position so as to pass through the first aperture 320. The tabs 324 are biased to a second, outwardly extending orientation in spaced relation from the secondary housing's walls 314-317 when the secondary housing 313 is in the second position, thereby preventing a return to the first position (see FIG. 17).

Figure 18:
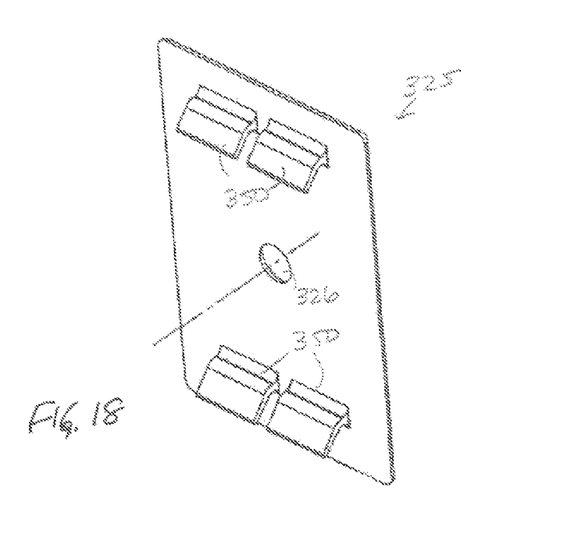
FIG. 18 is a back/side perspective view of an exemplary base housing cover for the embodiment of FIG. 15.
Figure 19A:
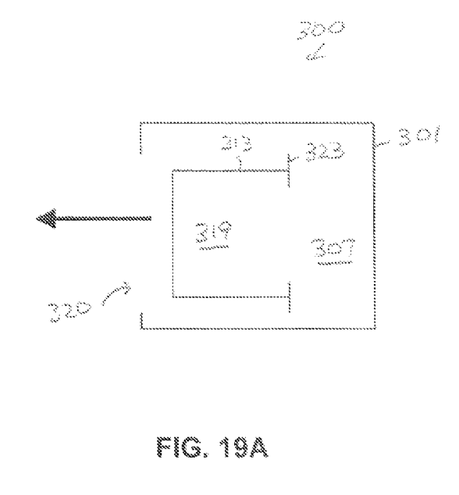
FIGS. 19A and 19B are schematic, cross-sectional views of the secondary housing of FIG. 18 being moved from the first to the second position.
Figure 19B:
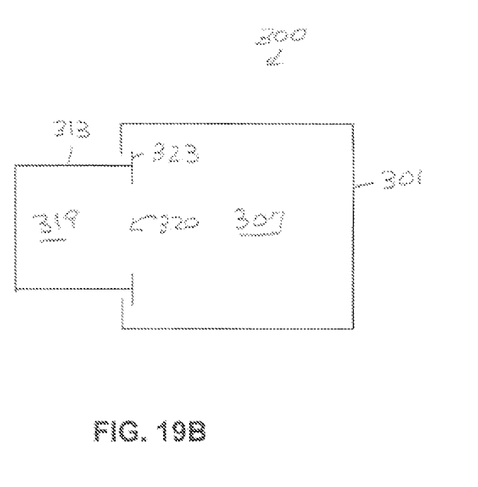

The system 300 also comprises a base housing cover plate 325 that is positionable to cover the base housing's first opening 308 and has a cord channel 326 formed therein that is adapted to allow passage of a signal-carrying cord therethrough (FIG. 18). The base housing's cover plate 325 is adapted for mounting onto the building surface in substantially flush relation therewith, and in covering relation to the first opening 308, via, for example, clips 350 that are insertable into commensurate slots 351 in the base housing 301.

A first signal receiver is positionable within the secondary housing's interior space 319 and is connectable to a first signal carrier. A second signal receiver is positionable within the base housing's inner chamber 307 and has a second connector that is positionable adjacent the third opening 310. The second connector is connectable to a second signal carrier.

Figure 20:
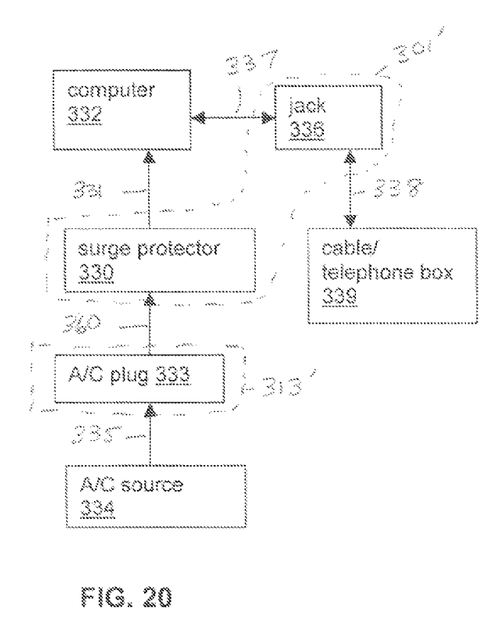
FIG. 20 is a system schematic for the invention being used to house a surge protector and cable or telephone jack.
Figure 21:
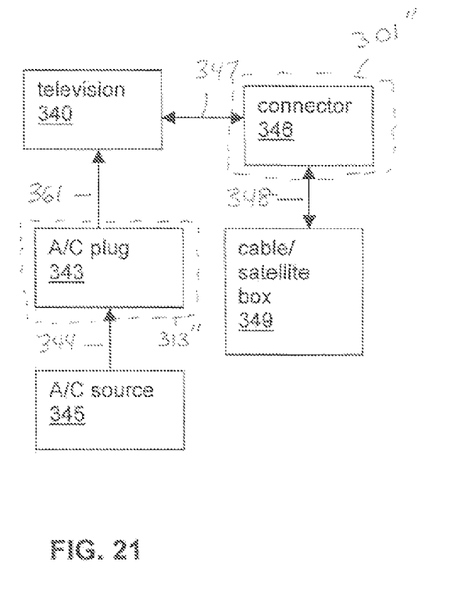
FIG. 21 is a system schematic for the invention being used to house an NC plug and connector for a television connectable to a cable or satellite receiver.

Two exemplary arrangements are illustrated in FIGS. 20 and 21. In FIG. 20, the system 300' is adapted to house a surge protector 330 within the base housing 301', for, for example, connection via wiring 331 to hardware such as a computer 332. The secondary housing 313' holds an NC plug 333, which, in turn, is connected to the surge protector 330 via wiring 360 and to an NC source 334 via wiring 335. A jack 336 is also positioned within the base housing 301' for connection via cabling 337 to the computer 332 and for connection via cabling 338 to a cable or telephone box 339 for providing Internet access, for example.

In FIG. 21, the system 300" is adapted to house devices for providing cable or satellite signal to a television 340. The base housing 301" is exposed to an A/C plug 343 from which the television 340 obtains power via wiring 361. The A/C plug 343 is housed in the secondary housing 313", which is connected via electrical wiring 344 to an NC source 345. A connector 346 is also positioned within the base housing 301" for connection via cabling 347 to the television 340 and additional cabling 348 to a cable or satellite box 349.

In the drawings and specification, there have been disclosed typical preferred embodiments of the invention and, although specific terms are employed, they are used in a generic and descriptive sense only and not for the purpose of limitation. The invention has been described in considerable detail with specific reference to these illustrated embodiments. It will be apparent, however, that various modifications and changes can be made within the spirit and scope of the invention as described in the foregoing specification and as defined in the attached claims. For example, a device, though illustrated in one embodiment as a cordless telephone, can instead comprise a cellular telephone, a cordless toothbrush, a cordless drill, a cordless vacuum, a personal data assistant, a computer or other type of processor, a surge protector, network connectors, cameras, microphones, and a vast array of other devices that can be positioned close to a signal outlet and have power cords or telecommunication cords which have significant lengthwise extent that are amenable to being stowed. The base housing cover plate supports can be within the structure of the base sidewalls of the base housing or positioned on the external surfaces of the base sidewalls. The illustrated pair of base housing cover plate mounts can instead be a single mount or a plurality of mounts, and the base housing cover plate need not be rectangular shaped. Also, for example, regarding the method of mounting an outlet housing, the power outlet housing was described as connected to the base housing in a step that occurred prior to connecting the wall mounting flange however, as with most of the steps, the order of connecting the power outlet housing and wall mounting flange to the base housing is not necessarily important. Additionally, although the mounting of the combination device was primarily described and illustrated with respect to a building structure, it is within the scope of the present invention to mount the combination base housing and power outlet housing within or affixed to a piece of furniture or even a building fixture.

What is claimed is:

1. A system for mounting a pair of signal-receiving devices in a recessed position within a building surface comprising:
   a base housing having a wall defining an inner chamber, the wall having a first opening in a front thereof and a second and a third opening therein, each of the first, the second, and the third opening leading into the inner chamber, the base housing positionable behind a building surface;
   a secondary housing positionable behind the building surface and adjacent the base housing and having a wall defining a closable interior space, the wall having a first aperture therethrough into the interior space positionable in communication with the base housing second opening, the wall further having a second aperture therethrough into the interior space, the second aperture in spaced relation from the base housing wall;
   a first signal receiver positionable within the secondary housing interior space as part of the wall defining the closed interior space and is connectable through a first connector to a first signal carrier within the secondary housing inner chamber; and
   a second signal receiver terminating within the base housing inner chamber and having a second connector positionable adjacent the third opening, the second connector able to receive a signal from a second signal carrier through the second signal receiver;
   wherein the first signal carrier and the second signal carrier are distinct and different enough to be non-interchangeable with each other.

2. The mounting system recited in claim 1, wherein the base housing further comprises a wall mounting flange connected to an outer surface of the base housing wall for providing connection to a structural element behind the building surface.

3. The mounting system recited in claim 1, wherein the first signal receiver comprises a power outlet, the first connector comprises a power outlet socket, and the first signal carrier comprises electrical wiring.

4. The mounting system recited in claim 1, wherein the second signal receiver comprises a data jack, the second connector comprises a data jacket socket, and the second signal carrier comprises data cabling.

5. The mounting system recited in claim 1, further comprising a base housing cover plate positioned to cover the base housing first opening and having an aperture formed therein adapted to allow passage of at least one signal-carrying cord therethrough.

6. The mounting system recited in claim 5, wherein the base housing cover plate is adapted for mounting onto the building surface in substantially flush relation therewith and in covering relation to the base housing first aperture.

7. The mounting system recited in claim 5, further having a hardware mount adapted to connect to a mounting element of a hardware device to thereby mount the hardware device to an interior wall of the building structure.

8. The mounting system recited in claim 1, wherein the second signal receiver comprises a surge protector, the second connector comprises an electrical outlet, and the second signal carrier comprises electrical wiring.

9. The mounting system recited in claim 8, wherein the first signal receiver and the first connector comprise a data jack, and the first signal carrier comprises one of cable wiring and/or telephone wiring.

10. The mounting system recited in claim 1, wherein:
    the second signal receiver and the second connector comprise an electrical outlet, and the second signal carrier comprises electric wiring; and
    the first signal receiver comprises a television signal receiver, the first connector comprises a television signal connector, and the first signal carrier comprises one of television cabling wiring and/or and satellite signal wiring.

11. The mounting system recited in claim 1, wherein:
    the base housing has a first rail adjacent the second opening;
    the secondary housing has a second rail adjacent the first aperture; and the first and the second rail are adapted to engage each other for slidably connecting the secondary housing to the base housing.

12. The mounting system recited in claim 1, wherein:
    the secondary housing is dimensioned at a first surface opposed to the first aperture smaller than the base housing second opening;

the secondary housing has a protrusion at a second surface adjacent the first aperture and opposed to the first surface dimensioned larger than the base housing second opening;

the secondary housing is movable between the first position within the base housing inner chamber and a second position wherein the secondary housing first surface is outside the base housing inner chamber and the secondary housing secondary surface is retained within the base housing inner chamber by the secondary housing protrusion.

13. The mounting system recited in claim 12, wherein the secondary housing further comprises a deformable tab generally parallel to the protrusion and closer to the base housing second opening when the secondary housing is in the first position, the deformable tab depressible to a first orientation adjacent the secondary housing wall when the secondary housing is being moved from the first position to the second position so as to pass through the first aperture, and biased to a second orientation in spaced relation from the secondary housing wall when the secondary housing is in the second position, for preventing the secondary housing from moving to the first position without a further depression of the tab.

14. The mounting system recited in claim 1, wherein the wall defining the closable interior space of the secondary housing further comprises a cover associated with the first signal receiver.

15. The mounting system recited in claim 1, wherein the inner chamber is further provided to access both the first signal receiver and the second signal receiver when positioned behind a building surface.

16. A method for mounting a pair of signal-receiving devices in a recessed position within a building surface comprising the steps of:
    positioning a base housing behind a building surface, the base housing having a wall defining an inner chamber, the wall having a first opening in a front thereof and a second and a third opening therein, each of the first, the second, and the third opening leading into the inner chamber, the base housing positionable behind a building surface;
    positioning a secondary housing behind the building surface and adjacent the base housing, the secondary housing having a wall defining a closable interior space, the wall having a first aperture therethrough into the interior space positionable in communication with the base housing second opening, the wall further having a second aperture therethrough into the interior space, the second aperture in spaced relation from the base housing wall;
    positioning a first signal receiver, as a part of the wall defining the closed interior space, within the secondary housing interior space;
    connecting the first signal receiver to a first signal carrier within the secondary housing inner chamber;
    positioning a second signal receiver terminating within the base housing inner chamber;
    positioning a second connector adjacent the third opening; and
    connecting the second connector to a second signal carrier within the base housing inner chamber wherein the second signal carrier is distinct and different enough from the first signal carrier to be non-interchangeable with the first signal carrier.

17. The mounting method recited in claim 16, further comprising the step of positioning a base housing cover plate in covering relation to the base housing first opening, the base housing cover plate having an aperture formed therein adapted to allow passage of at least one signal-carrying cord therethrough.

18. The mounting method recited in claim 16, wherein the second signal receiver comprises a surge protector, the second connector comprises an electrical outlet, and the second signal comprises electrical wiring.

19. The mounting method recited in claim 18, wherein the first signal receiver and the first connector comprise a data jack, and the first signal carrier comprises one of data cabling and/or telephone wiring.

20. The mounting method recited in claim 16, wherein:
    the second signal receiver and the second connector comprise an electrical outlet, and the second signal carrier comprises electrical wiring; and
    the first signal receiver comprises a television signal receiver, the first connector comprises a television signal connector, and the first signal carrier comprises one of television cable wiring and/or satellite signal wiring.

21. The mounting method recited in claim 16, further comprising the step of moving the secondary housing from a first position within the base housing inner chamber to a second position wherein a portion of the secondary housing is outside the base housing inner chamber and another portion of the secondary housing is retained within the base housing inner chamber.

* * * * *